(12) United States Patent
Gruhlke et al.

(10) Patent No.: US 7,538,405 B2
(45) Date of Patent: May 26, 2009

(54) SEMICONDUCTOR SENSOR USING SURFACE PLASMONS TO INCREASE ENERGY ABSORPTION EFFICIENCY

(75) Inventors: Russell W. Gruhlke, San Jose, CA (US); Charles E. Potter, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 59 days.

(21) Appl. No.: 11/331,267

(22) Filed: Jan. 13, 2006

(65) Prior Publication Data

US 2007/0164377 A1 Jul. 19, 2007

(51) Int. Cl.
*H01L 31/062* (2006.01)
*H01L 31/113* (2006.01)
*H01L 31/0232* (2006.01)

(52) U.S. Cl. .................. 257/436; 257/290
(58) Field of Classification Search .............. 257/466, 257/290–292, 431–444
See application file for complete search history.

(56) References Cited

U.S. PATENT DOCUMENTS

| | | | | |
|---|---|---|---|---|
| 4,178,604 A | * | 12/1979 | Nakamura et al. | ............ 372/96 |
| 4,482,779 A | | 11/1984 | Anderson | |
| 4,583,818 A | * | 4/1986 | Chen et al. | .................... 385/37 |
| 4,900,370 A | * | 2/1990 | Itoga et al. | .................. 136/256 |
| 5,157,537 A | | 10/1992 | Rosenblatt | |
| 5,404,373 A | * | 4/1995 | Cheng | ................... 372/50.124 |
| 5,841,143 A | | 11/1998 | Tuma et al. | |
| 5,991,488 A | * | 11/1999 | Salamon et al. | ............. 385/129 |
| 6,297,443 B1 | * | 10/2001 | Nakajima et al. | ........... 136/258 |
| 2003/0103150 A1 | * | 6/2003 | Catrysse et al. | ............. 348/272 |
| 2004/0056179 A1 | * | 3/2004 | Wang et al. | ............... 250/214.1 |
| 2005/0269578 A1 | | 12/2005 | Barnes et al. | |

OTHER PUBLICATIONS

Dmitruk et al., "Photosensitivity control of detectors based on surface plasmon-polariton resonance in Schottky structures", Proceedings of the 21st International Conference on Microelectronics (MIEL '97), Niš, Yugoslavia, Sep. 14-17, 1997, vol. 1, pp. 309-314, IEEE.

Dmitruk et al., "Sulfur passivation for photosensitivity control of detectors with corrugated metal—III-V semiconductors interface", Proceedings of the International Semiconductor Conference, 1997 (CAS '97), Sinaia, Romania, Oct. 7-11, 1997, vol. 1, pp. 263-266, IEEE.

Dmitruk et al., "Influence of multilayer coating peculiarities on efficiency of surface plasmon resonance photodector", Proceedings of the International Semiconductor Conference, 1998 (CAS '98), Sinaia, Romania, Oct. 6-10, 1998, vol. 2, pp. 531-534, IEEE.

Dmitruk et al., "New advanced polaritonic photodetector on base of surface barrier structure", Proceedings of the 23rd International Conference on Microelectronics (MIEL 2002), Niš, Yugoslavia, May 12-15, 2002, pp. 313-316, IEEE.

Dmitruk, N. L., "Physical Properties of Surface Barrier Structures with Microrelief Semiconductor-Metal Interface", *Proc. 20th International Conference on Microelectronics*, (Sep. 1995).

* cited by examiner

*Primary Examiner*—Cuong Q Nguyen (57) ABSTRACT

Surface plasmons are used to increase an energy absorbing efficiency of a semiconductor sensor.

10 Claims, 6 Drawing Sheets

SEMICONDUCTOR SENSOR USING SURFACE PLASMONS TO INCREASE ENERGY ABSORPTION EFFICIENCY

BACKGROUND OF THE INVENTION

There are many kinds of semiconductor sensors which have many uses. In particular, silicon sensors are widely used in imaging technologies such as video cameras, digital cameras, and optical navigation devices.

The silicon layer in the silicon CMOS image sensors used in optical navigation devices is typically made as thin as possible to minimize the amount of silicon used and obtain as compact a device as possible. Infrared light tends to pass through the silicon layer in such silicon CMOS image sensors without being absorbed. Thus, the silicon in the silicon CMOS image sensor is too thin to absorb the infrared light with a desired energy absorption efficiency.

SUMMARY OF THE INVENTION

The invention relates to using surface plasmons to increase an energy absorption efficiency of a semiconductor sensor.

BRIEF DESCRIPTION OF THE DRAWINGS

Embodiments in accordance with the invention are described below in conjunction with the accompanying drawings of which.

DETAILED DESCRIPTION OF THE EMBODIMENTS

Reference will now be made in detail to embodiments in accordance with the invention, examples of which are illustrated in the accompanying drawings, wherein like reference numerals refer to the like elements throughout. The embodiments in accordance with the invention are described below.

If there were a way to bend the light incident on a silicon CMOS image sensor by 90° after it penetrates into the silicon, the light could then travel across the width of a pixel which might be on the order of 5 to 6 μm wide, rather than through the thickness of the silicon which might be only on the order of 1 μm thick or less, thereby increasing the distance the light travels through the silicon, and thus increasing the probability that the light will be absorbed and create electron-hole pairs This can be done using surface plasmons.

A surface plasmon can be thought of as a very highly attenuated guided wave that is constrained to follow a metal/dielectric interface, and is a combined oscillation of the electromagnetic field and the surface charges of the metal. A surface plasmon is not a light radiative state or a plane wave because its electric field profile decays exponentially away from the metal/dielectric interface. The electric field of a surface plasmon is called an evanescent wave.

Figure 1:
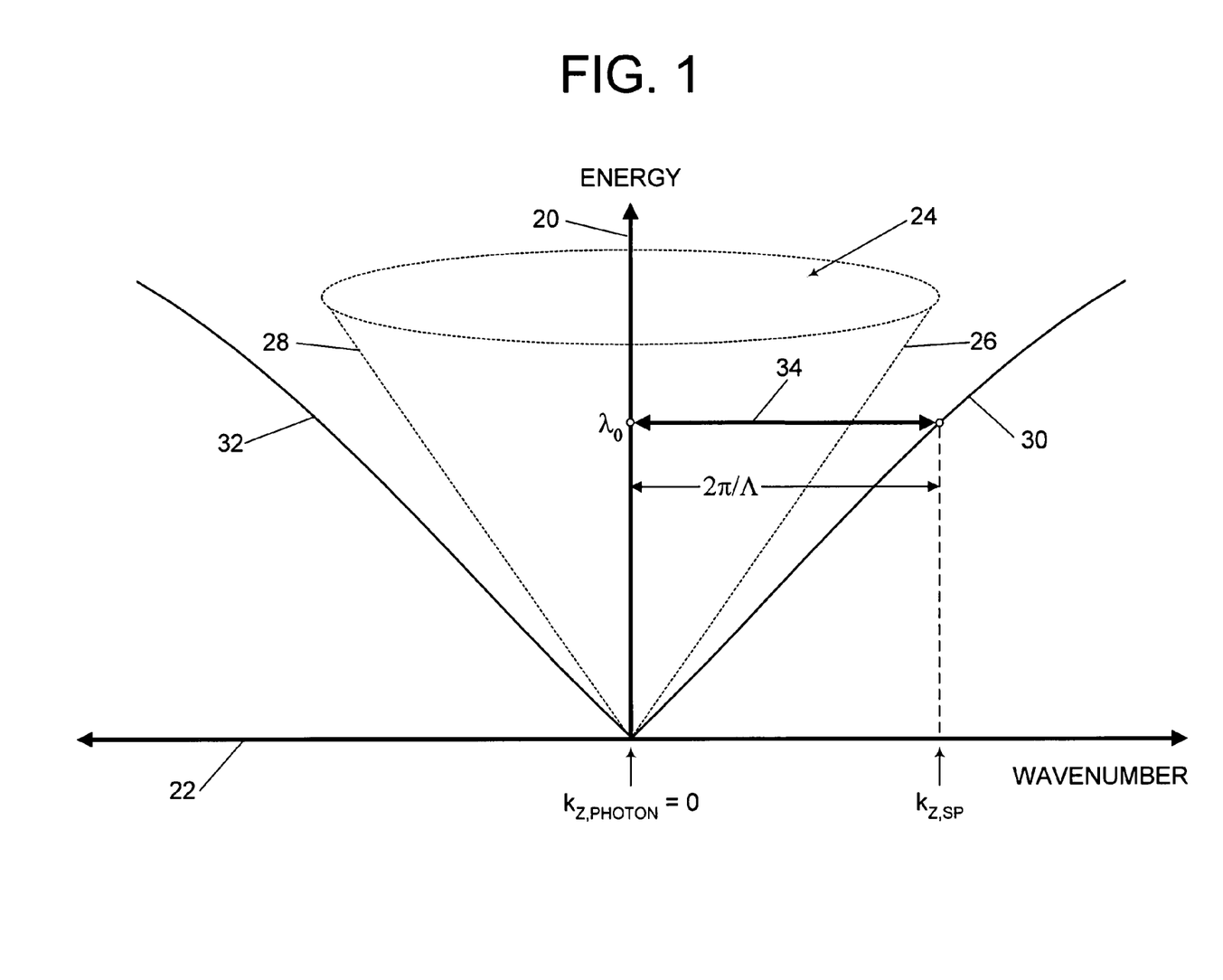
FIG. 1 is a graph of energy versus wavenumber showing a relationship between light radiative states or plane wave states lying within a light cone and surface plasmon states lying on surface plasmon dispersion curves, and showing a coupling of a surface plasmon state to a photon state in accordance with the invention.

FIG. 1 shows a graph of energy plotted on a vertical energy axis 20 versus wavenumber $k_Z$ plotted on a horizontal wavenumber axis 22. The wavenumber $k_Z$ is a component of a wavenumber k parallel to some interface along the Z axis.

The wavenumber k is defined by the following equation:

$$k = \frac{2\pi}{\lambda} \qquad \text{Equation 1}$$

where λ is a wavelength.

The wavenumber $k_Z$ is defined by the following equation:

$$k_Z = \frac{2\pi}{\lambda} \cdot \sin\theta \qquad \text{Equation 2}$$

where λ is a wavelength and θ is an angle of incidence measured from the normal to the interface.

The interface is a metal/dielectric interface along which surface plasmons propagate, and the metal/dielectric interface is substantially parallel to a light incident surface of a dielectric layer, which may be a semiconductor layer, such as a silicon layer. Thus, a photon incident on the light incident surface of the dielectric layer travels through the dielectric layer before it reaches the metal/dielectric interface. The wavenumber $k_{Z,PHOTON}$ of such a photon is defined by the following equation:

$$k_{Z,PHOTON} = \frac{2\pi}{\lambda} \cdot n_d \cdot \sin\theta \qquad \text{Equation 3}$$

where λ is the wavelength of the photon in a vacuum, $n_d$ is the index of refraction of the dielectric, and θ is the angle of incidence of the photon measured from the normal to the metal/dielectric interface.

Momentum p is defined by the following equation:

$$p = \hbar k \qquad \text{Equation 4}$$

where $\hbar$ ("h bar") is the reduced Planck's constant (Planck's constant divided by $2\pi$), and k is the wavenumber. As can be seen from Equation 4, momentum is directly proportional to wavenumber. Thus, as wavenumber increases along the wavenumber axis 22 in FIG. 1, momentum also increases.

Energy is inversely proportional to wavelength. Thus, as energy increases along the energy axis 20 in FIG. 1, wavelength decreases.

Each point in the graph in FIG. 1 represents a photonic state where the properties of that state are its energy (or wavelength) and its wavenumber (or momentum).

A light radiative state or a plane wave state, that is, light propagating in free space or in some material, always must lie within a light cone 24 shown in FIG. 1. The light cone 24 represents all possible light radiative states or plane wave states. The right half of the light cone 24 on the right side of the energy axis 20 represents all possible light radiative states or plane wave states that propagate in a forward direction, and the left half of the light cone 24 on the left side of the energy axis 20 represents light radiative states or plane wave states that propagate in a backward direction. The energy axis 20 extending through the center of the light cone 24 represents light radiative states or plane wave states that propagate normal to the interface. A diagonal line 26 represents light radiative states or plane wave states that propagate parallel to the interface in the forward direction, and a diagonal line 28 represents light radiative states or plane wave states that propagate parallel to the interface in the backward direction.

All possible states of a surface plasmon propagating forward along a metal/dielectric interface are represented by a surface plasmon dispersion curve 30 to the right of the energy axis 20, and all possible states of a surface plasmon propagating backward along the metal/dielectric interface are represented by a surface plasmon curve 32 to the left of the energy axis 20.

In FIG. 1, $k_{Z,SP}$ is a wavenumber of a surface plasmon. The relationship between $k_{Z,SP}$ and a frequency f of the surface plasmon is a dispersion relation for the surface plasmons, and is given by the following equation:

$$k_{Z,SP} = \frac{2\pi f}{c} \sqrt{\frac{\varepsilon_m \varepsilon_d}{\varepsilon_m + \varepsilon_d}} \qquad \text{Equation 5}$$

where c is the speed of light, $\varepsilon_m$ is the permittivity of the metal, and $\varepsilon_d$ is the permittivity of the dielectric. However, for any material, $\varepsilon$ is a function of frequency, so Equation 5 is more complicated than it appears at first glance. Surface plasmon dispersion curves like surface plasmon curves 30 and 32 in FIG. 1 can be obtained by plotting frequency f as a function of $k_{Z,SP}$ in accordance with Equation 5. Surface plasmon dispersion curves 30 and 32 in FIG. 1 are merely representational in nature and are provided merely to illustrate the general appearance of surface plasmon dispersion curves. However, surface plasmon curves will always lie outside light cone 24.

The relationship between frequency f and wavelength $\lambda$ is given by the following equation:

$$f = \frac{c}{\lambda} \qquad \text{Equation 6}$$

where c is the speed of light. Substituting this relationship for f in Equation 5 results in the following relationship between the wavenumber $k_{Z,SP}$ of the surface plasmon and a wavelength $\lambda$ of the surface plasmon:

$$k_{Z,SP} = \frac{2\pi}{\lambda} \sqrt{\frac{\varepsilon_m \varepsilon_d}{\varepsilon_m + \varepsilon_d}} \qquad \text{Equation 7}$$

The wavenumber $k_{Z,SP}$ (and thus the momentum) of any state on the surface plasmon dispersion curve 30 on the right side of the energy axis 20 in FIG. 1 will always be greater than the wavenumber $k_{Z,PHOTON}$ (and thus the momentum) of any light radiative state at the same energy (or wavelength $\lambda$) because the surface plasmon dispersion curve 30 lies outside the light cone 24. The same situation applies on the left side of the energy axis 20. Thus, any surface plasmon state is a nonradiative state and under normal circumstances can never be coupled with a light radiative state because momentum would not be conserved.

However, this inability to couple a surface plasmon state to a light radiative state can be overcome by introducing a grating or corrugated surface at the metal/dielectric interface. In the presence of a grating or corrugated surface, the wavenumber of any photonic state will change by the following amount:

$$\pm \frac{2\pi}{\Lambda} \cdot m \qquad \text{Equation 8}$$

where $\Lambda$ is the periodicity of the grating or corrugated surface, and m is a diffraction order equal to an integer 1, 2, 3 . . . , which will be assumed to be equal to 1 in this discussion.

Thus, the wavenumber $k_{Z,PHOTON}$ of a photon having a wavelength $\lambda_0$ as shown in FIG. 1 will increase by $2\pi/\Lambda$ and become equal to the wavenumber $kZ,SP$ of a surface plasmon having the same wavelength $\lambda 0$. Since the photon and the surface plasmon have the same wavelength, they also have the same energy, and since they now have the same wavenumber, they also now have the same momentum, and therefore the surface plasmon can couple to the photon since both energy and momentum are conserved. This coupling is represented by line 34 in FIG. 1. Thus, when the photon of wavelength $\lambda 0$ is incident on the metal/dielectric interface, it is converted into a surface plasmon of wavelength $\lambda 0$ which propagates along the meta/dielectric interface. The relationship between $k_{Z,SP}$ and $k_{Z,PHOTON}$ in this situation is defined by the following equation:

$$k_{Z,SP} = k_{Z,PHOTON} + \frac{2\pi}{\Lambda} \qquad \text{Equation 9}$$

Substituting the expressions for $k_{Z,SP}$ and $k_{Z,PHOTON}$ from Equations 4 and 8 above into Equation 9 results in the following equation:

$$\frac{2\pi}{\lambda_0} \sqrt{\frac{\varepsilon_m \varepsilon_d}{\varepsilon_m + \varepsilon_d}} = \frac{2\pi}{\lambda_0} \cdot n_d \cdot \sin\theta + \frac{2\pi}{\Lambda} \qquad \text{Equation 10}$$

where $\lambda_0$ is the wavelength $\lambda_0$ shown in FIG. 1. Equation 10 can be solved to find a periodicity $\Lambda$ of a grating or corrugated surface required to couple a photon having a wavelength $\lambda_0$ and an angle of incidence $\theta$ measured from a normal to the metal/dielectric interface to a surface plasmon having the same wavelength $\lambda_0$ propagating along the metal dielectric interface.

As can be seen from Equation 10, any change in either wavelength $\lambda_0$ or incident angle $\theta$ will require a corresponding change in $\Lambda$. The periodicity $\Lambda$ given by Equation 10 is the periodicity of a grating or corrugated surface having a sinusoidal profile. Such a grating or corrugated surface will only couple light of a single wavelength $\lambda_0$ at a single incident angle $\theta$ (or in a very narrow range of incident angles centered about $\theta$) to surface plasmons. However, a silicon CMOS image sensor used in an optical navigation device will typically receive incident light over a range of ±30° from normal.

To increase the range of incident angles over which light can be coupled to surface plasmons, the grating or corrugated surface may be provided with a non-sinusoidal profile, in effect blurring the sinusoidal profile. Such a non-sinusoidal profile will contain a range of periodicities because any non-sinusoidal profile may be represented as a Fourier series of sinusoidal profiles having different periodicities. A rectangular profile will have a very wide range of periodicities.

Figure 2:
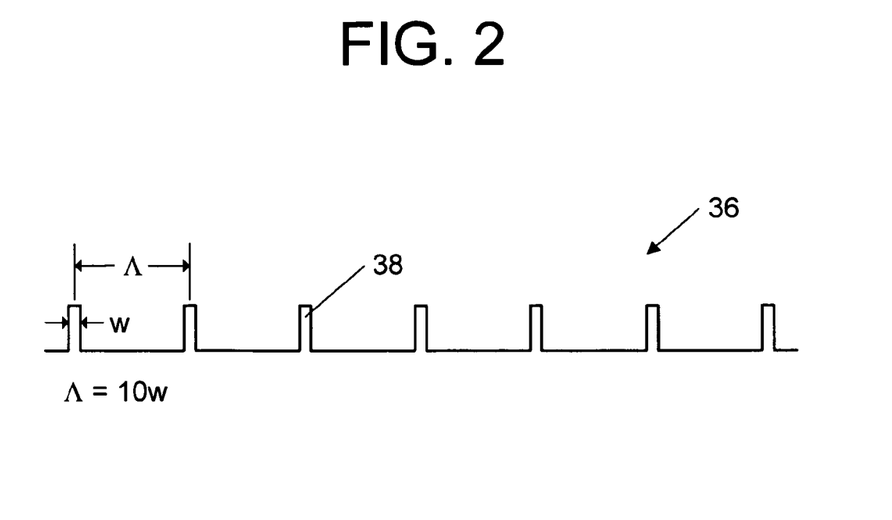
FIG. 2 is a diagram of a corrugated surface having a rectangular profile in accordance with the invention.

FIG. 2 shows an example of a grating or corrugated surface 36 having a rectangular profile, wherein $\Lambda$ is a period of the grating or corrugated surface 36, w is a width of projections 38 of the grating or corrugated surface 36, and $\Lambda=10$ w.

Figure 3:
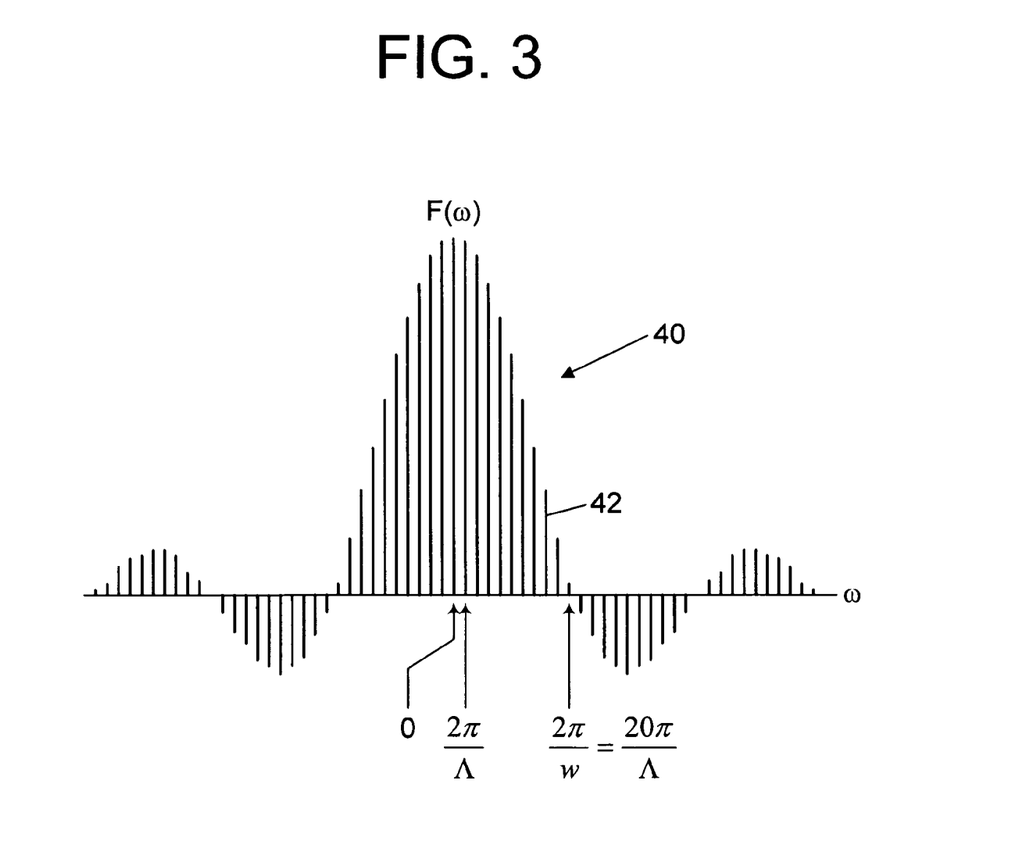
FIG. 3 is the Fourier spectrum of the rectangular profile of the corrugated surface shown in FIG. 2 in accordance with the invention.

FIG. 3 shows a Fourier spectrum 40 of the rectangular profile of the grating or corrugated surface 36 in FIG. 2. The horizontal axis is frequency $\omega$ and the vertical axis which extends through $\omega=0$ is the magnitude $F(\omega)$ of the Fourier spectrum 40. The vertical bars are Fourier components 42 of the Fourier spectrum 40, and are equally spaced along the $\omega$ axis by $2\pi/\Lambda$ extending in both directions from $\omega=0$, that is, at frequencies $\omega=\pm2\pi/\Lambda, \pm4\pi/\Lambda, \pm6\pi/\Lambda, \pm8\pi/\Lambda \ldots$. A first zero of the Fourier spectrum 40 occurs in a vicinity of $\omega=\pm2\pi/w$, or $\omega=\pm20\pi/\Lambda$ since $\Lambda=10$ w.

The Fourier components 42 of the Fourier spectrum in FIG. 3 may be considered to represent sinusoidal profiles having periodicities $\Lambda, \Lambda/2, \Lambda/3, \Lambda/4 \ldots$ included in the rectangular profile of the grating or corrugated surface 36 in FIG. 2, and thus represent possible couplings of one surface plasmon to multiple photons having the same wavelength $\lambda$ and different angles of incidence $\theta$, or having different wavelengths $\lambda$ and the same angle of incidence $\theta$.

Figure 4:
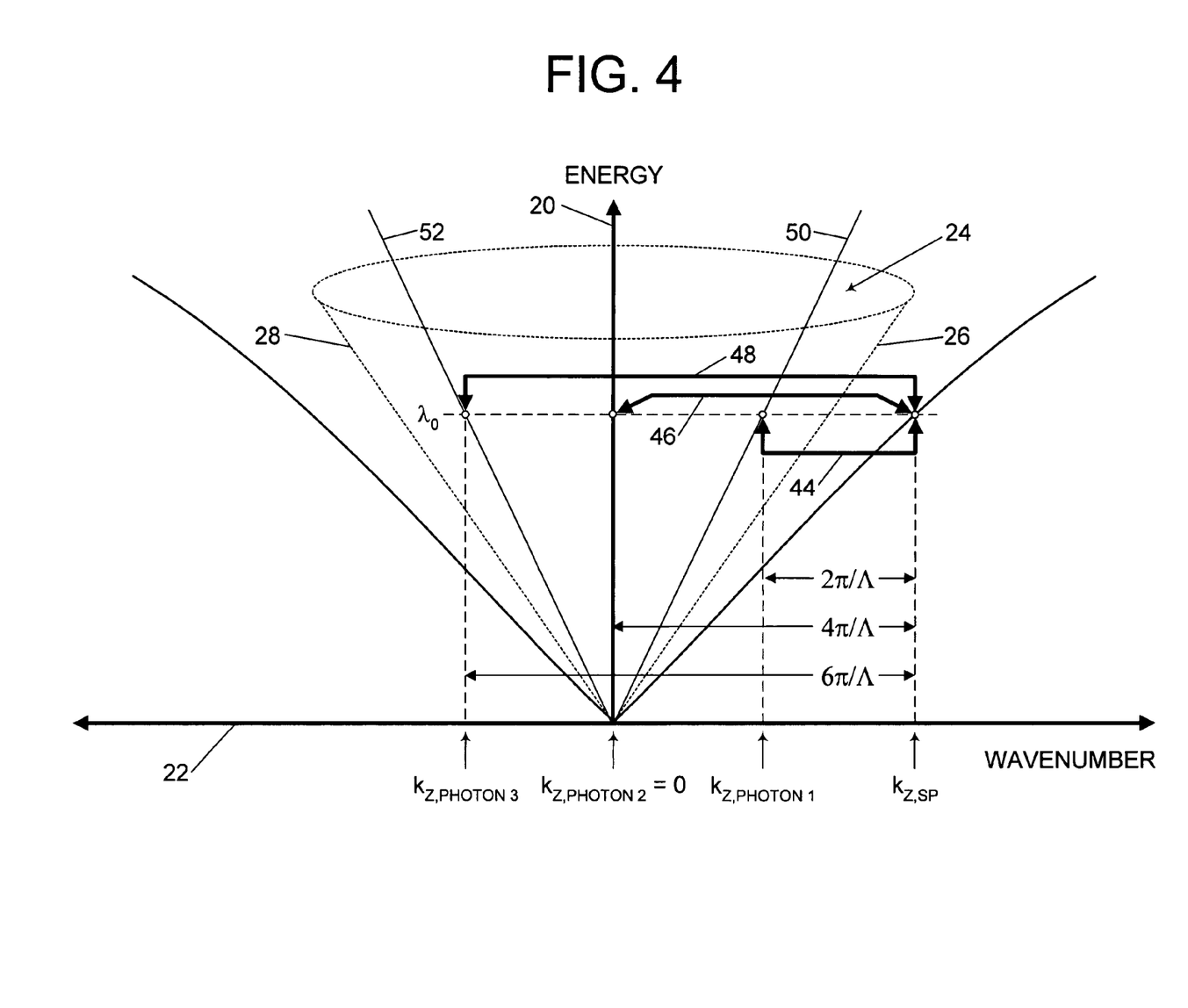
FIG. 4 is a graph of energy versus wavenumber showing a relationship between light radiative states or plane wave states lying within a light cone and surface plasmon states lying on surface plasmon dispersion curves, and showing three different couplings of one surface plasmon to three different photons in accordance with the invention.

FIG. 4 shows three different couplings 44, 46, and 48 of one surface plasmon to three different photons having the same wavelength $\lambda_0$ which are incident on the grating or corrugated surface 36 having the rectangular profile shown in FIG. 2 at three different angles of incidence $\theta$ represented by the diagonal line 50, the energy axis 20, and the diagonal line 52.

Coupling 44 is between a surface plasmon having a wavenumber $k_{Z,SP}$ and a photon having a wavenumber $k_{Z,PHOTON1}$ which is increased by $2\pi/\Lambda$, corresponding to the Fourier component having a frequency $2\pi/\Lambda$ shown in FIG. 3 which represents a sinusoidal profile having a periodicity $\Lambda$.

Coupling 46 is between the surface plasmon having the wavenumber $k_{Z,SP}$ and a photon having a wavenumber $k_{Z,PHOTON2}=0$ which is increased by $4\pi/\Lambda$, corresponding to the Fourier component having a frequency $4\pi/\Lambda$ shown in FIG. 3 which represents a sinusoidal profile having a periodicity $\Lambda/2$.

Coupling 48 is between the surface plasmon having a wavenumber $k_{Z,SP}$ and a photon having a wavenumber $k_{Z,PHOTON3}$ which is increased by $6\pi/\Lambda$, corresponding to the Fourier component having a frequency $6\pi/\Lambda$ shown in FIG. 3 which represents a sinusoidal profile having a periodicity $\Lambda/3$.

Figure 5:
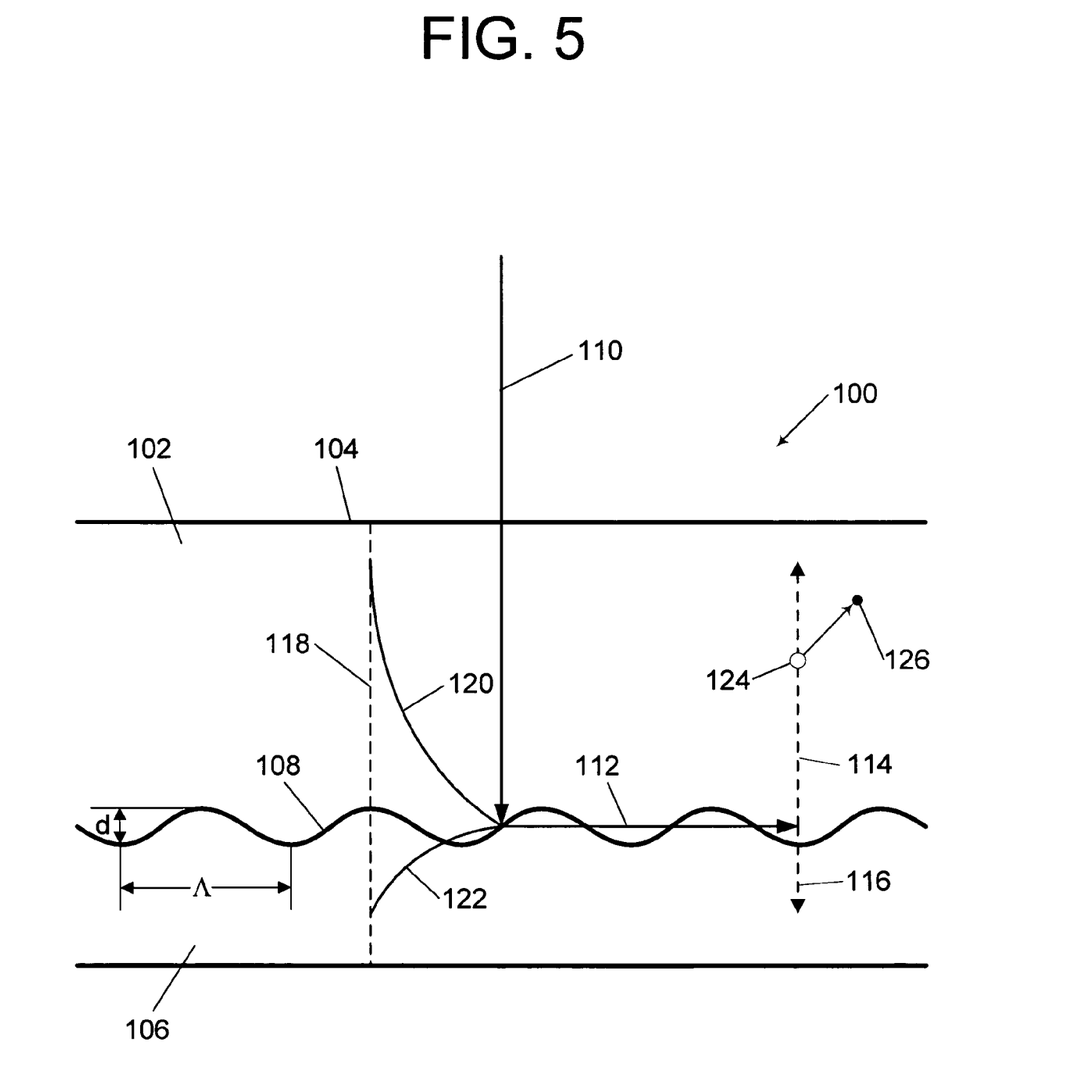
FIG. 5 is diagram of a silicon CMOS image sensor showing a photon being converted to a surface plasmon at a corrugated metal/semiconductor interface in accordance with the invention.

FIG. 5 shows a silicon CMOS image sensor 100 in accordance with the invention. The other details of a silicon CMOS image sensor are known in the art, and are omitted here for the sake of simplicity.

The silicon CMOS image sensor 100 includes a silicon layer 102 having an incident light surface 104 on one side and a corrugated surface on the opposite side having a periodicity $\Lambda$ and a depth d, and a metal layer 106 having a corrugated surface matching the corrugated surface of the silicon layer 102 (thus having a periodicity $\Lambda$) and contacting the corrugated surface of the silicon layer 102 to form a corrugated interface 108 having a periodicity $\Lambda$ between the silicon layer 102 and the metal layer 106. For the reasons discussed above, the corrugated interface 108 preferably has a nonsinusoidal profile.

The metal layer 106 may be made out of any metal that is suitable for use in a silicon CMOS image sensor, such as Ag, Au, Al, Ni, or any other suitable metal. Ag has the lowest losses for surface plasmons, but is more reactive than Au, so Au might be preferable to use even though it has higher losses for surface plasmons than Ag. The metal layer preferably has a thickness in a range from 100 nm to 1000 nm, but any thickness can be used as long as the resulting structure is capable of generating surface plasmons.

A photon 110 incident on the incident light surface 104 penetrates the silicon layer 102 and is converted to a surface plasmon 112 when it reaches the corrugated interface 108. The surface plasmon 112 propagates along the corrugated interface 108 substantially parallel to the light incident surface 104.

The photon 110 may have any wavelength, but is preferably infrared light. Suitable wavelengths of infrared light are 780 nm and 980 nm, although infrared light having any wavelength may be used.

The periodicity $\Lambda$ of the corrugated interface 108 is calculated for the wavelength $\lambda_0$ of the photon 110 using Equation 10 described above, and may be calculated assuming an incident angle of 0° relative to the normal of the light incident surface 104.

The depth d of the corrugated interface 108 will affect the efficiency of the coupling between the photon 110 and the surface plasmon 112. If the depth d is too shallow, almost no coupling will occur, since no coupling at all occurs for a flat profile. Also, if the depth d is too deep, for example, on the order of the wavelength of the photon 110, the efficiency of the coupling will be low. The optimum depth d may be determined by experimentation since it will depend on the particular configuration being used. However, an optimum depth d for infrared light will probably be between 50 nm and 100 nm.

The surface plasmon 112 generates an evanescent wave having a component 114 which extends away from the corrugated interface 108 into the silicon layer 102 and a component 116 which extends away from the corrugated interface 108 into the metal layer 106. The evanescent wave has an electric field profile which is shown with respect to a reference axis 118 which represents an electric field of zero. The component 114 of the evanescent wave which extends into the silicon layer 102 and the component 116 of the evanescent wave which extends into the metal layer 106 decay exponentially as indicated by 120 and 122, respectively, with the component 114 extending into the silicon layer 102 decaying more slowly than the component 116 extending into the metal layer 106.

There is a probability that the component 114 of the evanescent wave extending into the silicon layer 102 will create an electron-hole pair consisting of a hole 124 and an electron 126. If this occurs, the surface plasmon 112 is absorbed. The probability that an electron-hole pair will be created depends on the path length of the surface plasmon 112—the longer the path length, the greater the probability that an electron-hole pair will be created. The invention increases the length of the energy absorption path in the silicon layer 102 by converting the photon 110 traveling through the thickness of the silicon layer 102 into the surface plasmon 112 traveling across the width or the length of the silicon layer 102, thus in effect bending the energy absorption path in the silicon layer 102 by 90°.

The electron 126 created when the surface plasmon 112 is absorbed is collected by the charge collection structure of the silicon CMOS image sensor 100, which is omitted in FIG. 4 for the sake of simplicity.

FIG. 5 shows that the corrugated interface 108 is formed by a silicon layer 102 and a metal layer 106, and thus is a metal/semiconductor interface. However, strictly speaking, a surface plasmon is a phenomenon associated with a metal/dielectric interface. A semiconductor has an electrical conductivity intermediate between that of a dielectric (or insulator) and a conductor. Depending on the semiconductor material and any doped impurities in the semiconductor material, any particular semiconductor may be more dielectric-like or more conductor-like.

Figure 6:
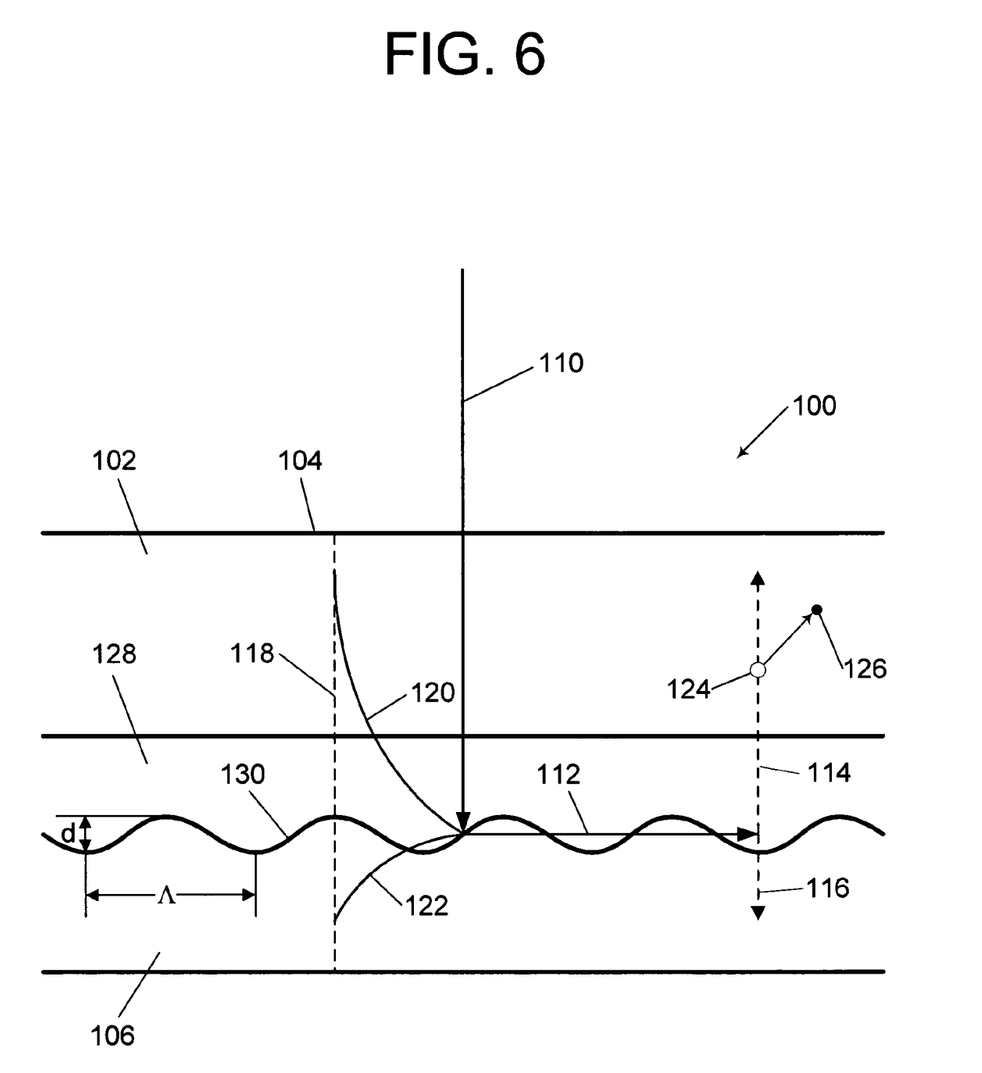
FIG. 6 is diagram of a silicon CMOS image sensor showing a photon being converted to a surface plasmon at a corrugated metal/dielectric interface in accordance with the invention.

While it is believed that most semiconductors will be sufficiently dielectric-like to enable generation of surface plasmons at a metal/semiconductor interface, there may some semiconductors for which this is not the case. Accordingly, to ensure that surface plasmons will always be generated, a dielectric layer 128 may be provided between the semiconductor layer 102 and the metal layer 106 as shown in FIG. 6, thereby forming a corrugated metal/dielectric interface 130. A suitable material for dielectric layer 128 is $SiO_2$, but any dielectric material suitable for use in a silicon CMOS image sensor may be used. The dielectric layer must be thin enough so that the component 114 of the evanescent wave of the surface plasmon 112 can extend into the silicon layer 102 so it can create an electron-hole pair.

Figure 7:
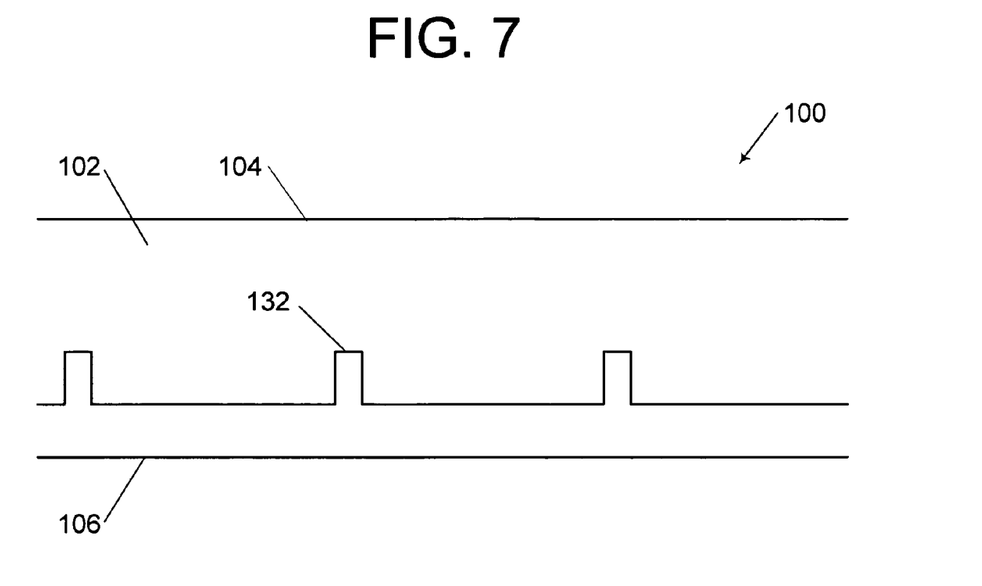
FIG. 7 is a diagram of a silicon CMOS image sensor with a corrugated metal/semiconductor interface having a rectangular profile in accordance with the invention.

FIG. 7 shows a modification of the silicon CMOS image sensor 100 in FIG. 5 in which a corrugated interface 132 between the silicon layer 102 and the metal layer 106 has a rectangular profile.

Figure 8:
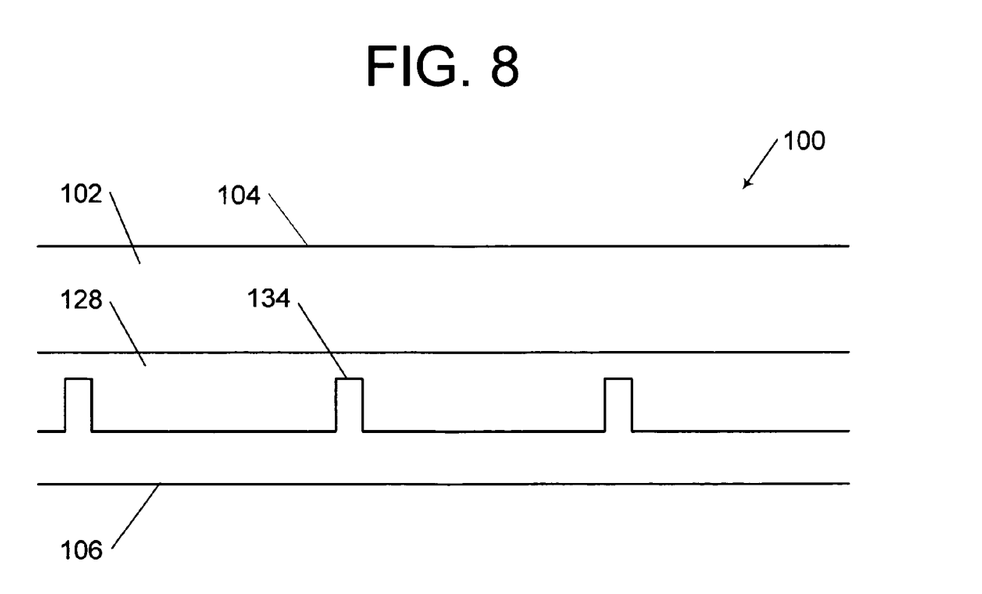
FIG. 8 is a diagram of a silicon CMOS image sensor with a corrugated metal/dielectric interface having a rectangular profile in accordance with the invention.

FIG. 8 shows a modification of the silicon CMOS image sensor 100 in FIG. 6 in which a corrugated interface 134 between the dielectric layer 128 and the metal layer 106 has a rectangular profile.

The rectangular profiles shown in FIGS. 3, 8, and 9 are not limited to the particular configurations shown in FIGS. 3, 8, and 9, and the period of the rectangular profile, the height and the width of the projections of the rectangular profile, and the ratio of the period of the rectangular profile to the width of the projections of the rectangular profile can be varied as necessary to obtain a suitable rectangular profile.

While the embodiments in accordance with the invention have been described above as being applicable to a silicon CMOS image sensor receiving infrared light, the invention is by no means limited to this, and is applicable to any semiconductor sensor receiving radiant energy at any wavelength where surface plasmons can exist. Other semiconductors which can be used in the invention besides Si include Ge, AlSb, GaSb, GaAs, GaP, InSb, InAs, InP, CdS, CdSe, ZnO, and ZnS, but any semiconductor can be used.

While the embodiments in accordance with the invention have been described above as being applicable to a silicon CMOS image sensor in which the silicon layer is too thin to absorb incident infrared light with a desired energy absorption efficiency, the invention is by no means limited to this, and is applicable to any device having a semiconductor layer that is too thin to absorb incident radiant energy with a desired energy absorption efficiency, and to any device having a semiconductor layer that absorbs incident radiant energy regardless of whether the semiconductor layer is too thin to absorb the incident radiant energy with a desired energy absorption efficiency.

While the embodiments in accordance with the invention have been described above as being applicable to a device including a semiconductor layer and a metal layer in which radiant energy is incident on the semiconductor layer, the invention is by no means limited to this, and is applicable to a device including a semiconductor layer and a metal layer in which radiant energy is incident on the metal layer, with the metal layer preferably being substantially transparent to the incident radiant energy.

Although a few embodiments in accordance with the invention have been shown and described, it would be appreciated by those skilled in the art that changes may be made in these embodiments without departing from the principles and spirit of the invention, the scope of which is defined in the claims and their equivalents.

What is claimed is:

1. A semiconductor sensor, comprising:
 a semiconductor layer having an incident surface to receive incident infrared radiant energy on one side of the semiconductor layer and having a corrugated surface on an opposite side of the semiconductor layer; and
 a metal layer having a corrugated surface matching the corrugated surface of the semiconductor layer and contacting the corrugated surface of the semiconductor layer to form a corrugated interface between the semiconductor layer and the metal layer, the corrugated interface being substantially parallel to the incident surface of the semiconductor layer;
 wherein the corrugated interface has a major axis that is substantially parallel to the incident surface, the corrugated interface has at least one periodicity associated therewith and a depth d ranging between about 50 nm and about 100 nm, the semiconductor layer, the metal layer, and the corrugated interface are configured, dimensioned and shaped to convert photons in the incident radiant energy into surface plasmons such that the surface plasmons travel along the corrugated interface in a direction substantially parallel to the incident surface and generate evanescent waves extending into the semiconductor layer which generate electron-hole airs in the semiconductor layer.

2. The semiconductor sensor of claim 1, wherein the semiconductor layer, the metal layer, and the corrugated interface are configured to cause the surface plasmons to be absorbed when the evanescent waves generate the electron-hole pairs in the semiconductor layer.

3. The semiconductor sensor of claim 1, wherein the corrugated interface has a nonsinusoidal profile.

4. The semiconductor sensor of claim 1, wherein the corrugated interface has a substantially rectangular profile.

5. The semiconductor sensor of claim 1, wherein the semiconductor sensor is a silicon CMOS image sensor; and
 wherein the incident radiant energy is infrared light.

6. A semiconductor sensor, comprising:
 a semiconductor layer having an incident surface to receive incident infrared radiant energy on one side of the semiconductor layer and having a contact surface on an opposite side of the semiconductor layer;
 a dielectric layer having a contact surface on one side of the dielectric layer contacting the contact surface of the semiconductor layer. and a corrugated surface on an opposite side of the dielectric layer; and a metal layer having a corrugated surface matching the corrugated surface of the dielectric layer and contacting the corrugated surface of the dielectric layer to form a corrugated interface between the dielectric layer and the metal layer, the corrugated interface being substantially parallel to the incident surface of the semiconductor layer;

wherein the corrugated interface has a major axis that is substantially parallel to the incident surface, the corrugated interface has at least one periodicity associated therewith and a depth d ranging between about 50 nm and about 100 nm, the semiconductor layer, the dielectric layer, the metal layer and the corrugated interface are configured, dimensioned and shaped to convert photons in the incident radiant energy into surface plasmons such that the surface plasmons travel along the corrugated interface in a direction substantially parallel to the incident surface and generate evanescent waves extending into the semiconductor layer which generate electron-hole pairs in the semiconductor layer.

7. The semiconductor sensor of claim 6, wherein the semiconductor layer, the dielectric layer, the metal layer and the corrugated interface are configured to cause the surface plasmons to be absorbed when the evanescent waves generate the electron-hole pairs in the semiconductor layer.

8. The semiconductor sensor of claim 6, wherein the corrugated interface has a nonsinusoidal profile.

9. The semiconductor sensor of claim 6, wherein the corrugated interface has a substantially rectangular profile.

10. The semiconductor sensor of claim 6, wherein the semiconductor sensor is a silicon CMOS image sensor; and wherein the incident radiant energy is infrared light.

* * * * *

UNITED STATES PATENT AND TRADEMARK OFFICE
CERTIFICATE OF CORRECTION

| | | |
|---|---|---|
| PATENT NO. | : 7,538,405 B2 | |
| APPLICATION NO. | : 11/331267 | |
| DATED | : May 26, 2009 | |
| INVENTOR(S) | : Russell W. Gruhlke et al. | |

It is certified that error appears in the above-identified patent and that said Letters Patent is hereby corrected as shown below:

Column 8, Line 47, Claim 1, delete "airs" and insert --pairs--.

Column 9, Line 1, Claim 6, delete "layer." and insert --layer,--.

Signed and Sealed this
Twenty-fifth Day of September, 2012

David J. Kappos
*Director of the United States Patent and Trademark Office*